US006840431B1

(12) United States Patent
Kim (10) Patent No.: US 6,840,431 B1
(45) Date of Patent: *Jan. 11, 2005

(54) METHODS OF BONDING TWO ALUMINUM-COMPRISING MASSES TO ONE ANOTHER

(75) Inventor: Jaeyeon Kim, Liberty Lake, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/659,867

(22) Filed: Sep. 12, 2000

Related U.S. Application Data

(62) Division of application No. 09/524,131, filed on Mar. 10, 2000.

(51) Int. Cl.[7] .......................... B23K 1/20; B23K 31/02; C23C 14/00
(52) U.S. Cl. ...................... 228/203; 228/193; 228/205; 228/262.5; 204/298.12
(58) Field of Search ................................ 228/203, 205, 228/193, 262.5; 204/298.12, 298.13, 298.14

(56) References Cited

U.S. PATENT DOCUMENTS 3,622,470 A  * 11/1971  Gowman ..................... 204/33
3,758,741 A  *  9/1973  Holko et al. ................. 219/91

(List continued on next page.)

FOREIGN PATENT DOCUMENTS

| EP | 0 370 211 | | 5/1990 | |
| EP | 0 575 166 A1 | | 12/1993 | |
| EP | 0 590 904 A1 | | 4/1994 | |
| EP | 0 630 423 | * | 12/1994 | |
| EP | 0881311 A1 | * | 12/1998 | |
| EP | 0 881 311 A1 | | 12/1998 | |
| GB | 2241914 A | * | 9/1991 | .................. 228/193 |
| JP | 06226455 | * | 9/1991 | .............. 228/262.5 |
| JP | 6-65733 | | 3/1994 | |
| JP | 9 143704 | | 6/1997 | |
| JP | 10 330928 | | 12/1998 | |
| WO | WO 97/28044 | | 8/1997 | |
| WO | WO 98/26107 | | 6/1998 | |
| WO | 01/01488 | | 1/2001 | |
| WO | 01/ 07404 | | 3/2001 | |

OTHER PUBLICATIONS

Stig W. Bolgen, Flocking Technology, 21 Journal of Coated Fabrics 123–131 (Oct. 1991).
A. Kato et al., Formation of a Very Low–Reflectance Surface by Electrostatic Flocking, 4th European Symposium on Space Environmental and Control Systems, Florence, Italy (Oct. 21–24, 1991), pp. 565–568.
Masayuki Shigematsu et al., Application of Electrostatic Flocking to Thermal Control Coating, Institute of Space Astronautical Science, Tokyo, Japan, pp. 583–586. (No Date Available).

(List continued on next page.)

Primary Examiner—Tom Dunn
Assistant Examiner—L. Edmondson
(74) Attorney, Agent, or Firm—Wells St. John P.S.

(57) ABSTRACT

The invention encompasses a method of bonding a first mass to a second mass. A first mass of first material and a second mass of second material are provided and joined in physical contact with one another. The first and second masses are then diffusion bonded to one another simultaneously with the development of grains of the second material in the second mass. The diffusion bonding comprises solid state diffusion between the first mass and the second mass. A predominate portion of the developed grains in the second material have a maximum dimension of less than 100 microns. The invention also encompasses methods of forming a physical vapor deposition target bonded to a backing plate.

13 Claims, 7 Drawing Sheets

U.S. PATENT DOCUMENTS

| | | | |
|---|---|---|---|
| 3,779,839 A * | 12/1973 | Kaihu et al. ................... 156/3 |
| 4,025,036 A * | 5/1977 | Melnyk ....................... 228/193 |
| 4,029,253 A * | 6/1977 | Cartossi ....................... 228/175 |
| 4,046,305 A * | 9/1977 | Brown et al. |
| 4,119,262 A * | 10/1978 | Yen et al. ................... 228/206 |
| 4,300,031 A * | 11/1981 | Reboux et al. ............. 219/617 |
| 4,352,450 A | 10/1982 | Edgington |
| 4,405,427 A * | 9/1983 | Byrd .......................... 204/477 |
| 4,420,385 A * | 12/1983 | Hartsough |
| 4,459,332 A | 7/1984 | Giglia .......................... 428/86 |
| 4,469,757 A | 9/1984 | Ghosh et al. |
| 4,485,429 A | 11/1984 | Mittal ......................... 361/386 |
| 4,496,095 A * | 1/1985 | Renshaw et al. ........... 228/102 |
| 4,603,731 A | 8/1986 | Oksen ......................... 165/41 |
| 4,685,987 A | 8/1987 | Fick ............................ 156/247 |
| 4,732,312 A * | 3/1988 | Kennedy et al. |
| 4,838,474 A * | 6/1989 | Ohashi et al. |
| 4,842,706 A | 6/1989 | Fukasawa et al. |
| 4,848,647 A | 7/1989 | Gentry et al. |
| 4,905,886 A * | 3/1990 | Kennedy et al. |
| 4,978,054 A | 12/1990 | Ferrando et al. |
| 5,009,765 A | 4/1991 | Qamar et al. |
| 5,014,161 A | 5/1991 | Lee et al. ................... 361/388 |
| 5,077,637 A | 12/1991 | Martorana et al. .......... 361/386 |
| 5,102,033 A * | 4/1992 | Woods et al. ........... 228/263.17 |
| 5,143,590 A * | 9/1992 | Strothers et al. ....... 204/298.12 |
| 5,150,748 A | 9/1992 | Blackmon et al. ............. 165/41 |
| 5,230,459 A * | 7/1993 | Mueller et al. |
| 5,268,236 A | 12/1993 | Dumont et al. |
| 5,342,496 A | 8/1994 | Stellrecht |
| 5,402,006 A | 3/1995 | O'Donley ................... 257/796 |
| 5,455,458 A | 10/1995 | Quon et al. ................. 257/714 |
| 5,542,471 A | 8/1996 | Dickinson ................... 165/170 |
| 6,199,259 B1 * | 9/1996 | Demaray et al. ............. 29/458 |
| 5,590,389 A | 12/1996 | Dunlop et al. |
| 5,599,467 A | 2/1997 | Okabe et al. |
| 5,674,585 A | 10/1997 | Ewing, Jr. et al. ............ 428/96 |
| 5,693,203 A * | 12/1997 | Ohhashi et al. ........ 204/298.12 |
| 5,695,847 A | 12/1997 | Browne ..................... 428/112 |
| 5,725,495 A | 3/1998 | Aihara et al. ............... 357/722 |
| 6,071,389 A * | 8/1998 | Zhang ................... 204/298.12 |
| 5,799,860 A | 9/1998 | Demaray et al. |
| 5,807,443 A * | 9/1998 | Masuda et al. ............. 148/535 |
| 5,836,506 A * | 11/1998 | Hunt et al. ................. 228/172 |
| 5,852,548 A | 12/1998 | Koon et al. ................. 361/704 |
| 5,873,973 A | 2/1999 | Koon et al. ............. 156/272.4 |
| 5,938,103 A * | 8/1999 | Hill et al. .................... 228/115 |
| 6,073,830 A | 6/2000 | Hunt et al. |
| 6,085,966 A | 7/2000 | Shimomuki et al. |
| 6,164,519 A | 12/2000 | Gilman et al. |
| 6,227,432 B1 | 5/2001 | Enomoto et al. |
| 6,274,015 B1 * | 8/2001 | Beier et al. ................. 148/415 |
| 6,391,465 B1 * | 5/2002 | Zheng et al. ................ 428/448 |
| 2002/0003010 A * | 5/1999 | Shah et al. ................. 148/518 |
| 2002/0028538 A1 | 3/2002 | Parfeniuk et al. |
| 2002/0039810 A1 * | 4/2002 | Parfeniuk et al. ........... 438/118 |
| 2002/0174917 A1 | 11/2002 | Segal et al. |

OTHER PUBLICATIONS

U.S. Appl. No. 09/103,415, Smith et al., filed Jun. 24, 1998.

Davis, J. R., "ASM Specialty Handbook: Aluminum and Aluminum Alloys", date unknown, p. 320.*

Porter, D. et al., "Phase Transformation in Metals and Alloys", date unknown, pp. 75–83.*

U.S. Appl. No. 09/488,973, Parfeniuk et al., filed Jan. 20, 2000.

* cited by examiner

METHODS OF BONDING TWO ALUMINUM-COMPRISING MASSES TO ONE ANOTHER

RELATED PATENT DATA

This patent resulted from a divisional application of U.S. patent application Ser. No. 09/524,131, which was filed on Mar. 10, 2000.

TECHNICAL FIELD

The invention pertains to methods of bonding physical vapor deposition (PVD) target materials to backing plate materials, and also pertains to methods of bonding two aluminum-comprising masses to one another. Further, the invention pertains to structures comprising aluminum-comprising physical vapor deposition targets bonded to aluminum-comprising backing plates.

BACKGROUND OF THE INVENTION

Figure 1:
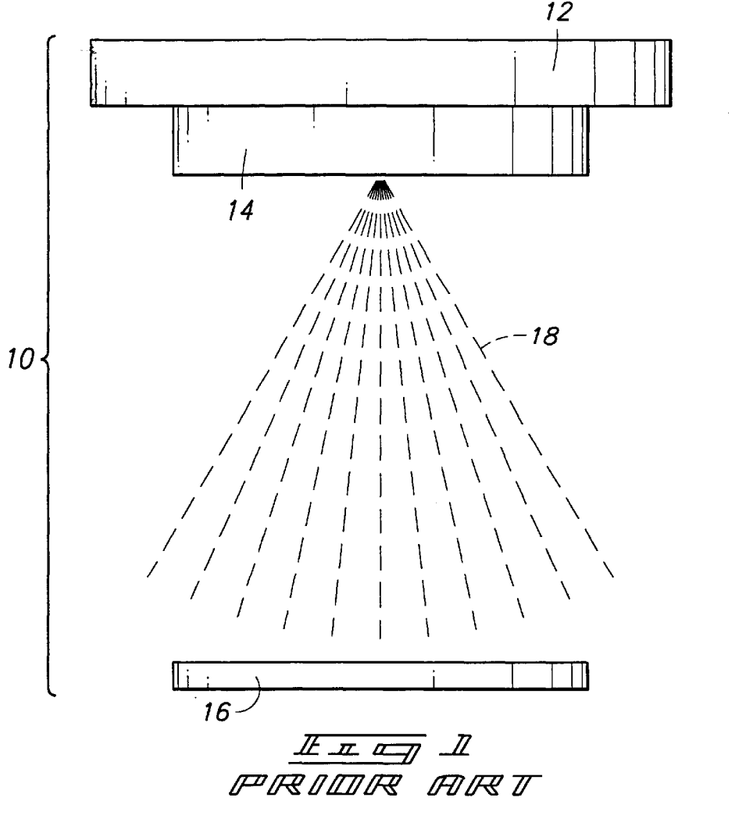
FIG. 1 is a diagrammatic view of a portion of a prior art sputter deposition apparatus.

Modern developments in physical vapor deposition methodologies have created increasingly stringent requirements for robust bonding between targets and backing plates. A diagrammatic view of a portion of an exemplary sputter deposition apparatus 10 is shown in FIG. 1. Apparatus 10 comprises a backing plate 12 having a sputtering target 14 bonded thereto. A semiconductive material wafer 16 is within apparatus 10 and provided to be spaced from target 14. Sputtered material 18 is displaced from target 14 and utilized to form a coating (not shown) over wafer 16.

Among the modern improvements in sputter design is an increase in the distance between target 14 and semiconductive material substrate 16. Such increase in distance can enable more directional sputtering to be achieved over features of substrate 16 than can be achieved when target 14 is close to substrate 16 by allowing atoms that are not moving perpendicular to substrate 16 to land on the sidewall of the sputtering chamber. Specifically, substrate 16 will frequently have vertical holes or slots (known as vias) with depths five times their width or more (i.e., having relatively high critical dimensions). It is difficult to sputter materials into vias having high critical dimensions unless there is a relatively long throw between a sputtering target and a substrate comprising the vias.

Although the longer throw creates advantages in coverage relative to shorter throw techniques, it also creates complications. One of such complications is caused by additional power utilized in long-throw technologies. The additional power can cause sputtering targets to get hotter than they had in older methods. Such heat can disrupt a bond formed between backing plate 12 and target 14. For instance, if target 14 is solder-bonded to backing plate 12, the heat developed during long-throw sputtering techniques can be sufficient to melt the solder bond and actually break target 14 free from backing plate 12. Accordingly, solder-bonding can be inappropriate for long-throw sputtering techniques.

It would be desirable to develop improved methods for bonding physical vapor deposition targets to backing plates.

SUMMARY OF THE INVENTION

In one aspect, the invention encompasses an aluminum-comprising physical vapor deposition target bonded to an aluminum-comprising backing plate to a bond strength of greater than 10,000 pounds/in$^2$.

In another aspect, the invention encompasses a method of bonding a first aluminum-comprising mass to a second aluminum-comprising mass. The first aluminum-comprising mass has a first surface, and the second aluminum-comprising mass has a second surface. At least one of the first and second surfaces is exposed to a mixture comprising HF and $HNO_3$, and the first surface is then contacted with the second surface. The first and second masses are pressed together to bond the first mass to the second mass.

In yet another aspect, the invention encompasses a method of bonding a physical vapor deposition target material to a backing plate material. The target material and backing plate material are joined in physical contact with one another. The target material and backing plate material are then compressed under a load that progresses sequentially as follows: (1) the load is maintained at a first pressure of at least about 4 ksi for a time of at least about 20 seconds; (2) the load is increased by at least about 0.5 ksi to a new pressure; and (3) the load is maintained at the new pressure for at least about 20 seconds.

BRIEF DESCRIPTION OF THE DRAWINGS

Preferred embodiments of the invention are described below with reference to the following accompanying drawings.

FIG. 6 is a graphical comparison of hardness for a backing plate formed according to a method encompassed by the present invention (labeled as a new process) relative to a conventional process (labeled as an old process).

FIG. 7 is a graphical illustration of a load profile encompassed by the present invention for pressing a target material and a backing plate material together.

FIG. 10 is a graphical comparison of the dependence of yield strength of a backing plate on temperature for a backing plate formed according to a process of the present invention (labeled as a new process) and a backing plate formed according to a conventional process (labeled as an old process).

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses methods of bonding materials to one another, and in particular embodiments encompasses methods of bonding a physical vapor deposition target material to a backing plate material.

Figure 2:
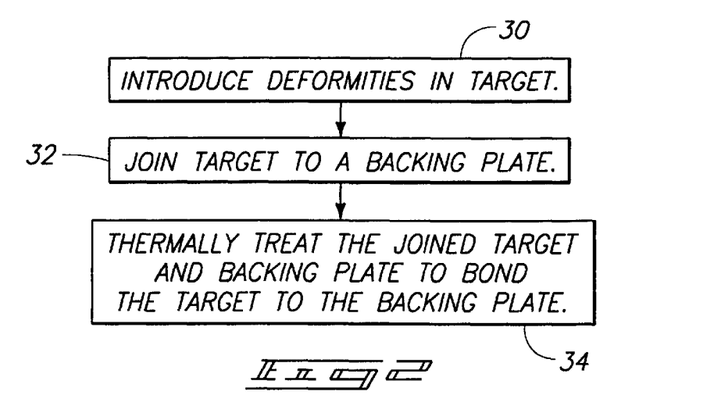
FIG. 2 is a flow chart diagram of a method encompassed by the present invention.
Figure 3:
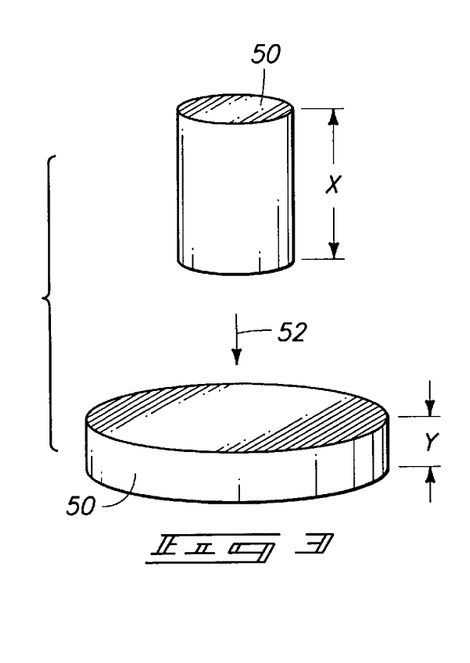
FIG. 3 is a diagrammatic illustration of a method of introducing work hardening into a target material.

A method encompassed by the present invention is described by a flow diagram in FIG. 2. At an initial step (labeled 30 in FIG. 2) work hardening is done to a target material. If, for example, the target material comprises aluminum, work hardening can be introduced by compressing the aluminum from an initial thickness to a second thickness. Such compression is illustrated in FIG. 3, wherein a target 50 is illustrated before and after compression, with an arrow 52 provided to indicate the step of compression. Target 50 comprises a first thickness "X" prior to the compression 52 and a second thickness "Y" after the compression. The compression can be accomplished by, for example, cold forging or cold rolling. The final thickness of target 50 ("Y") can be, for example, less than 2% of the initial thickness of target 50 (i.e., at least a 98% compression), and is typically less than or equal to about 40% of the initial thickness of target 50 (i.e., at least a 60% compression). In particular embodiments, target 50 can be subjected to a 95% compression (i.e., compressed so that final thickness "Y" is about 5% of initial thickness "X").

Target 50 can, for example, comprise or consist essentially of low to high purity aluminum. Target 50 can, for example, comprise an aluminum-comprising mass consisting essentially of aluminum. Alternatively, target 50 can comprise an aluminum-comprising mass consisting essentially of aluminum with greater than 0% and less than 10% of other elements selected from the group consisting of Si, Cu, Ge, Pb, Sn, Ag, Ga, Hf, Mg, Mn, Sc, Zn, B, Ba, Be, C, Ca, Cd, Ce, Co, Cr, Dy, Er, Fe, Gd, Ho, Ir, La, Lu, Mo, Nb, Nd, Ni, P, Pd, Pm, Pr, Pt, Pu, Rh, Ru, S, Sb, Se, Sm, Sr, Ta, Tb, Te, Ti, Tm, V, W, Y, Yb and Zr. The so-called "other elements" can be in elemental form, in the form of multi-element materials, such as, for example, complexes and compounds.

An exemplary material that can be utilized for target 50 is high purity aluminum comprising 0.5% copper (by weight) and 0.2% silicon (by weight). Other exemplary target materials comprise aluminum with greater than 0% and less than 10% copper (by weight), and with less than 10% silicon (by weight). For instance, the target material can consist essentially of aluminum with 0.5% copper (by weight). Suitable high purity aluminum materials include aluminum that is greater than or equal to 99.95% pure, such as, for example, aluminum that is 99.995% pure, 99.9995% pure, or 99.99995% pure.

The material of target 50 can be cast as a billet having a diameter of less than 15 inches, and typically from about 4 inches to about 9 inches. The billet can have an initial thickness of from about 0.1 inches to about 10 inches, and typically has an initial thickness of from about 5 inches to 10 inches. After the compression of target 50, the resulting cold-worked blank can be cut to form a round blank of a desired diameter.

Referring again to the flow chart of FIG. 2, the target is joined to a backing plate (FIG. 2, step 32). Preferably, the target and backing plate are cleaned prior to joining them to remove contaminants that may be present.

The cleaning can comprise exposing both the target and backing plate to organic cleaning materials. Preferably, the cleaning further comprises exposing at least one of the target and backing plate to a mixture comprising HF and $HNO_3$ for a time of from about one second to about 30 minutes, and at a temperature of from about 0° C. to about 100° C. The exposure can, for example, occur at about room temperature (i.e., a temperature of from about 15° C. to about 25° C.), for a time of less than 30 seconds, such as, for example, for a time of about 15 seconds.

Although the solution of $HF/HNO_3$ has beneficial effects on an aluminum-comprising surface during a preferred short exposure time, if the exposure time is too long the acidic solution can etch or pit a surface of an aluminum-comprising material. A particular appropriate length of exposure time can be influenced by a temperature of the $HF/HNO_3$ solution. Specifically, higher temperatures are generally associated with shorter exposure times, and lower temperatures are generally associated with longer exposure times.

The cleaning mixture which comprises HF and $HNO_3$ can consist essentially of HF, $HNO_3$ and $H_2O$, and in particular embodiments can consist of HF, $HNO_3$ and $H_2O$. Such mixture can be formed by, for example, mixing from about 1 part to about 10 parts of a concentrated HF solution (wherein the concentrated HF solution comprises from about 48% to about 51% hydrofluoric acid in water, with "about" indicating variation of ±0.5%), from about 27 parts to about 49.5 parts of a concentrated $HNO_3$ solution (wherein the concentrated $HNO_3$ solution comprises from about 69% to about 71% nitric acid in water, with "about" indicating variation of ±0.5%), and from about 40.5 parts water to about 72 parts water. The concentrated HF can comprise, for example, about 48% HF in water; and the concentrated $HNO_3$ can comprise, for example, about 70% $HNO_3$ in water. The "parts" referred to above are determined by volume. The various components of the mixture can be mixed in any order, with an exemplary order being to first mix the nitric acid and water, and then subsequently to add the HF. The term "about" is used in reference to the parts of HF, $HNO_3$ and $H_2O$ to indicate variation of ±0.5 parts, except that the amount of $HNO_3$ is never 0 parts.

The cleaning mixture of HF and $HNO_3$ can advantageously remove inorganic and organic materials, and can thus remove several common contaminants and dopants from over and within an aluminum-comprising surface. For instance, the solution can remove organic contaminants that may be left on an aluminum-comprising surface from organic cleaning reagents. Also, the mixture can dissolve common dopants such as silicon, magnesium and copper that may be present in an aluminum-comprising material, as well as dissolving common impurities.

Figure 4:
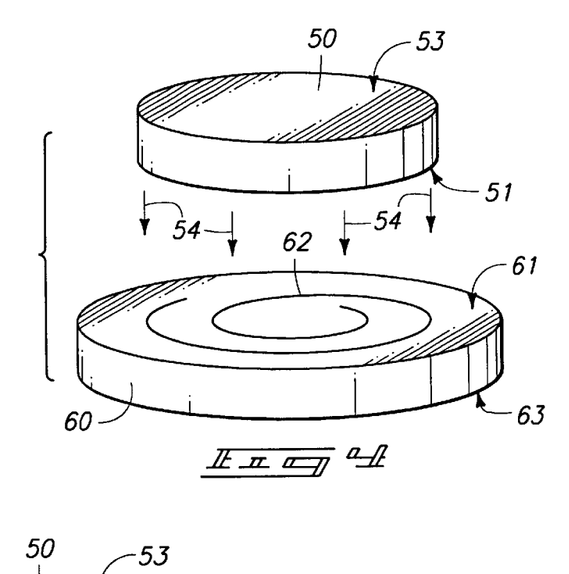
FIG. 4 is a diagrammatic illustration of the target material of FIG. 3 with a backing plate at a preliminary bonding step.
Figure 5:
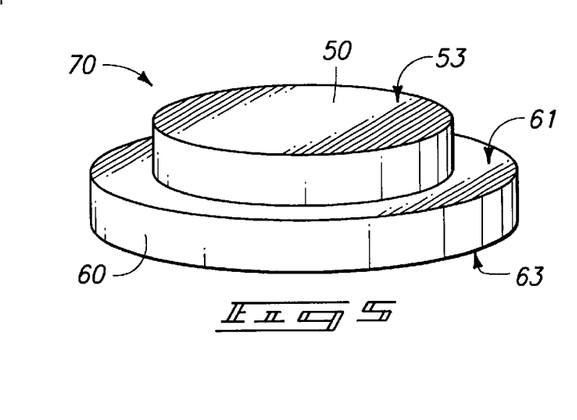
FIG. 5 is a diagrammatic view of the target material and backing plate of FIG. 4 at a bonding step subsequent to that of FIG. 4.

A method of joining a target to a backing plate is described with reference to FIGS. 4 and 5. Referring to FIG. 4, the work-hardened target 50 of FIG. 3 is shown elevated above a backing plate 60. Backing plate 60 of FIG. 3 is shown having a continuous channel 62 machined into a surface in a spiral pattern. Ultimately, target 50 will be pressed against plate 60 to force material from target 50 into channel 62.

Target 50 comprises a first surface 51 and an opposing second surface 53, while backing plate 60 comprises a first surface 61 and an opposing second surface 63. Ultimately, surface 51 of target 50 is to be compressed against surface 61 of backing plate 60.

Preferably, at least one of the surfaces 51 and 61 is cleaned with the mixture comprising $HF/HNO_3$ prior to compressing surface 51 against surface 61. More preferably, both of surfaces 51 and 61 are cleaned with the mixture comprising $HF/HNO_3$ prior to compressing the surfaces together. It is noted that surfaces 51 and 61 can be cleaned with the same solution, or can be cleaned with different solutions comprising $HF/HNO_3$. It is also noted that the cleaning of, for example, surface 51, can comprise exposing only surface 51 of target 50 to a solution comprising $HF/HNO_3$ by, for example, spraying a solution of $HF/HNO_3$ across the surface. Alternatively, an entirety of target 50 can be dipped within a solution of HF/HNO$_3$ so that both of surfaces 51 and 53 are exposed to the cleaning solution of HF/HNO$_3$. Similarly, surface 61 of backing plate 60 can be cleaned by spraying a solution of HF/HNO$_3$ across the surface, or by dipping an entirety of backing plate 60 within a solution of HF/HNO$_3$ so that both of surfaces 61 and 63 are exposed to the solution of HN/HNO$_3$.

The HF/HNO$_3$ solution is preferably removed from over any surfaces of target 50 or backing plate 60 which have been exposed to such solution. Such removal can be accomplished by, for example, spraying the surfaces with deionized water. The water can then be dried from the surfaces prior to joining surface 51 of target 50 to surface 61 of backing plate 60.

The cleaning of backing plate 60 can occur before or after formation of channel 62 within surface 61 of backing plate 60.

Although the invention is described herein with reference to treating an aluminum-comprising target material and aluminum-comprising backing plate, it is to be understood that the chemical cleaning solution of the present invention can be used to clean aluminum-comprising masses other than backing plates and physical deposition targets.

In embodiments in which target 50 comprises high-purity aluminum, backing plate 60 can also comprise aluminum, and can specifically comprise, for example, 2000 Series, 3000 Series, 4000 Series, 5000 Series, 6000 Series or 7000 Series heat-treatable aluminum alloys. Backing plate 60 can, for example, comprise an aluminum-comprising mass consisting essentially of aluminum. Alternatively, backing plate 60 can comprise an aluminum-comprising mass consisting essentially of aluminum with greater than 0% and less than 10% of other elements selected from the group consisting of Si, Cu, Ge, Pb, Sn, Ag, Ga, Hf, Mg, Mn, Sc, Zn, B, Ba, Be, C, Ca, Cd, Ce, Co, Cr, Dy, Er, Fe, Gd, Ho, Ir, La, Lu, Mo, Nb, Nd, Ni, P, Pd, Pm, Pr, Pt, Pu, Rh, Ru, S, Sb, Se, Sm, Sr, Ta, Tb, Te, Ti, Tm, V, W, Y, Yb and Zr. The so-called "other elements" can be in elemental form, in the form of multi-element materials, such as, for example, complexes and compounds.

In an exemplary application, backing plate 60 comprises 2024-T351 aluminum which has been subjected to temperature treatment of from about 250° F. to about 800° F. for a time of from about 10 minutes to about 1 week. The thermal treatment can comprise, for example, exposure to a temperature of from about 350° C. to about 400° C. for a time of from about 6 hours to about 12 hours. An typical thermal treatment comprises exposure of the backing plate to a temperature of about 375° F. for a time of about 8 hours. The temperature treatment can harden the 2024-T351 aluminum material, and can occur either before or after shaping backing plate 60 from a billet.

FIG. 6 shows a comparison of the hardness of a backing plate comprising 2024-T351 aluminum that has been treated to the above-described temperature treatment (labeled as "new process") relative to the hardness of a conventional backing plate (labeled as "old process), and after diffusion bonding processes described below. The "new process" backing plate is substantially harder than the "old process" backing plate.

An initial step in bonding target 50 to backing plate 60 is typically to join the target and backing plate by physically contact target 50 with plate 60. Arrows 54 of FIG. 4 indicate such joining by showing that target 50 is lowered onto plate 60. FIG. 5 shows an assembly 70 comprising target 50 joined to plate 60. In the shown assembly 70, target 50 covers channel 62 (FIG. 4) of backing plate 60. In embodiments in which the backing plate 60 is much harder than the target 50, the soft material of the target can be pressed into the channel in the hard backing plate during subsequent processing.

Assembly 70 can be formed in, or placed in, an atmosphere which is inert relative to oxide formation from materials of plate 60 and target 50. In embodiments in which plate 60 and target 50 comprise high-purity aluminum, or aluminum alloys, the inert atmosphere can comprise a vacuum (with a suitable vacuum being from $10^{-2}$ Torr to $10^{-7}$ Torr), can consist essentially of an inert gas (such as, for example, one or more of nitrogen gas, helium gas and argon gas); and can be formed, for example, by flushing a chamber with inert gas and subsequently drawing a vacuum on the chamber. The inert atmosphere preferably does not comprise oxidative components (like oxygen), as such could adversely cause oxidation of the materials of one or both of the blank 60 and target 50. It is noted, however, that an advantage of the HF/HNO$_3$ cleaning described above is that such can remove oxidizable impurities from a surface of an aluminum-comprising material. For instance, the HF/HNO$_3$ cleaning can remove the relatively easily oxidized material magnesium from a surface of an aluminum-comprising mass. Removal of relatively easily oxidizable materials can render the mass more robust relative to exposure to trace amounts of oxygen, particularly if the materials remaining at the surface are less easily oxidized than the materials which were removed by the HF/HNO$_3$ cleaning. Additionally, it is noted that a thin layer of aluminum oxide frequently forms over aluminum materials, and if such aluminum oxide forms over the aluminum-comprising mass the HF/HN0$_3$ cleaning can remove the aluminum oxide.

Ultimately, removal of aluminum oxide and readily easily oxidized materials can improve bonding of an aluminum-comprising target material to an aluminum-comprising bonding plate. Specifically, removal of easily oxidized materials and aluminum oxide from surfaces of one or both of the aluminum-comprising target and aluminum-comprising backing plate can allow better interaction (for example, can enhance diffusion) between the surfaces during a bonding process.

Referring again to the flow chart of FIG. 2, the joined backing plate and target are thermally treated to bond the target to the backing plate. If target 50 and backing plate 60 comprise high-purity aluminum, the thermal treatment can comprise, for example, heating the joined target and backing plate to a temperature of between 230° C. and 400° C. (preferably between 300° C. and 350° C.), and maintaining such temperature for a time of from about 2 minutes to about 10 hours. During the time that the temperature is maintained, target 50 and backing plate 60 can be compressed in a forge to pressure in excess of 4000 lbs/in$^2$ (i.e., 4 ksi), preferably in excess of 8 ksi, and more preferably in excess of 10 ksi. The compression of target 50 and backing plate 60 preferably occurs according to a load profile shown diagrammatically in FIG. 7. Specifically, at a time $T_0$ the target and backing plate are exposed to a pressure $P_0$ which effectively corresponds to a non-pressurized state. Subsequently, at a time $T_1$ compression starts and ramps to a first pressure $P_1$. The pressure $P_1$ is preferably at least about 4 ksi, and more preferably at least about 8 ksi. Pressure $P_1$ is maintained for a period of time until time $T_2$, whereupon the pressure is increased to $P_2$. The pressure $P_2$ is preferably at least 1 ksi greater than the pressure $P_1$, and can be, for example at least 2 ksi greater than $P_1$ or at least 5 ksi greater than $P_1$. Pressure $P_2$ is maintained until time $T_3$, whereupon the pressure is relaxed and allowed to slowly decrease to a pressure $P_3$ by a time $T_4$. The time between $T_1$ and $T_2$ is preferably at least about 20 seconds, and typically about 1 minute. The time between $T_2$ and $T_3$ preferably comprises at least about 20 seconds, and typically comprises about 1 minute. The time between $T_3$ and $T_4$ preferably comprises at least about 1 minute, and can comprise, for example, from 2 to 4 minutes, with 2½ or 3 minutes being typical. The pressure $P_3$ is typically greater than pressure $P_1$, and can be, for example, at least 0.5 ksi greater than pressure $P_1$, or at least 1 ksi greater than $P_1$. At time $T_4$, the pressure on the target and backing plate is released, to allow the pressure to return to $P_0$.

Preferred values for $P_1$, $P_2$ and $P_3$ vary depending on the nature of a target being treated, and the load profile of FIG. 7 can be applied to any target size, including 6 inch diameter targets, 8 inch diameter targets, 10 inch diameter targets and 12 inch diameter targets. $P_1$ can be, for example from about 4 ksi to about 10 ksi, $P_2$ can be from about 4 ksi to about 30 ksi, and $P_3$ can be from about 4 ksi to about 25 ksi. In particular applications, $P_1$ can be, for example from about 8 ksi to about 10 ksi, $P_2$ can be from about 12 ksi to about 20 ksi, and $P_3$ can be from about 10 ksi to about 15 ksi.

The load profile of FIG. 7 differs from traditional load profiles in the two-step pressure ramping occurring at times $T_1$ and $T_2$. In traditional load profiles, a pressure on target/backing plate structure is ramped to a desired pressure, and such pressure is maintained or slightly decreased during the time that the target/backing plate is compressed.

An exemplary thermal treatment procedure for treating a structure to form an aluminm-comprising target bonded to an aluminum-comprising backing plate is as follows. Initially, an assembly comprising a target joined against a backing plate is heated to a temperature of from about 230° C. to about 400° C. (preferably form about 300° C. to about 350° C.) and maintained at such temperature for a time of from 2 minutes to 10 hours. The assembly is then transferred to a forge which is also maintained at a temperature of from about 230° C. to about 400° C. The forge is utilized to compress target 50 and backing plate 60 together to a pressure in excess of 8 tons/in², utilizing the preferred load progression discussed above with reference to FIG. 7. After compressing the target and backing plate, the assembly is transferred back to the furnace having a temperature of from about 230° C. to about 400° C., and maintained at such temperature for an additional time of from about 2 minutes to about 10 hours.

The above-described exemplary method allows diffusion bonding (specifically, solid state diffusion of aluminum between target 50 and backing plate 60), as well as development of grains having 50 micron average grain size within target 50. Such grains form due to cold work introduced in target 50 during the compression of FIG. 3. The grain development typically involves three distinct steps. First, recovery in which stresses are relieved from in the most severely deformed regions. Second, the cold-worked grains recrystallize forming small, new, strain-free grains in target 50, and finally grain growth of the new grains occurs, depending on a temperature and time of exposure to the temperature. Preferably, target 50 is not exposed to a temperature above about 200° C. from the time it is work-hardened in the step of FIG. 3, until it is exposed to the thermal treatment. Accordingly, substantially an entirety of the grain development of target 50 occurs during the thermal treatment of the bonding process of target 50 and backing plate 60. The phrase "substantial entirety" is utilized in referring to the recrystallization and grain growth occurring during the thermal treatment, rather than stating an "entirety" of the recrystallization and grain growth to indicate that there may be a small and effectively inconsequential amount of recrystallization and grain growth occurring at temperatures below 230° C. during processing and cleaning of target 50 prior to the thermal treatment.

A particular process for accomplishing the above-discussed thermal treatment method is to place the assembly of the target and backing plate in a can (for instance, a can made of thin-walled aluminum), and to retain the assembly in the can during the heating and forging (i.e., pressing) associated with the diffusion bonding. The can preferably comprises two parts, and a wide flange which allows for subsequent welding to seal the target and backing plate assembly in the can. Also, the can preferably has a small diameter tube which allows for vacuum checking of a weld seal on the can, as well as for providing a vacuum or inert atmosphere inside the can. Once the target and backing plate assembly is provided in the can, the can is welded shut. An inert gas or vacuum can be utilized during the welding to alleviate oxidation of the target and backing plate assembly. Weld integrity can be determined by conducting a leak test using the small diameter tube. A final weld can be done on the small diameter tube to allow a vacuum or inert gas atmosphere to be maintained in the can. During the time that the target and backing plate assembly is subjected to diffusion bonding, a temperature of the assembly can be monitored indirectly by monitoring the temperature of a so-called dummy part having the same dimensions as the target and backing plate assembly, and heated in either the same furnace as the assembly, or in an identical furnace.

After the thermal treatment of the target and backing plate assembly, such assembly is cooled. The cooling can be accomplished by exposing the assembly to either a liquid or a gas, with an exemplary liquid being water, and an exemplary gas being air.

The methods discussed above can form a target and backing plate assembly 70 comprising a strong diffusion bond between target 50 and backing plate 60, with a tensile strength of such bond being greater than 10,000 psi.

In addition to the strong bond formed between target 50 and backing plate 60 of assembly 70, an average grain size of target 50 can be below 100 microns, and even below about 50 microns after bonding. Specifically, a predominate portion (i.e., more than 50%) of the grains in target 50 can have a maximum dimension of less than 100 microns, and even less than about 50 microns. The above-discussed small grain size can be accomplished by starting with a target which has been cold-worked, but which does not have grains formed. Accordingly, a recrystallization process will occur in the target material prior to growth of grains. For PVD-target aluminum, such recrystallization process typically takes from about 20 to 30 minutes at a temperature of between 200° C. and about 450° C., depending on the type and concentration of dopants. It is generally desired that aluminum grains remain relatively small (i.e., averaging less than 100 microns in size, and more preferably averaging less than 50 microns) in targets comprising high purity aluminum (e.g., elemental aluminum), and aluminum alloys. The smaller grains can improve sputtering processes in which aluminum is sputtered from the target material relative to sputtering occurring from a target material having larger grains.

Figure 8:
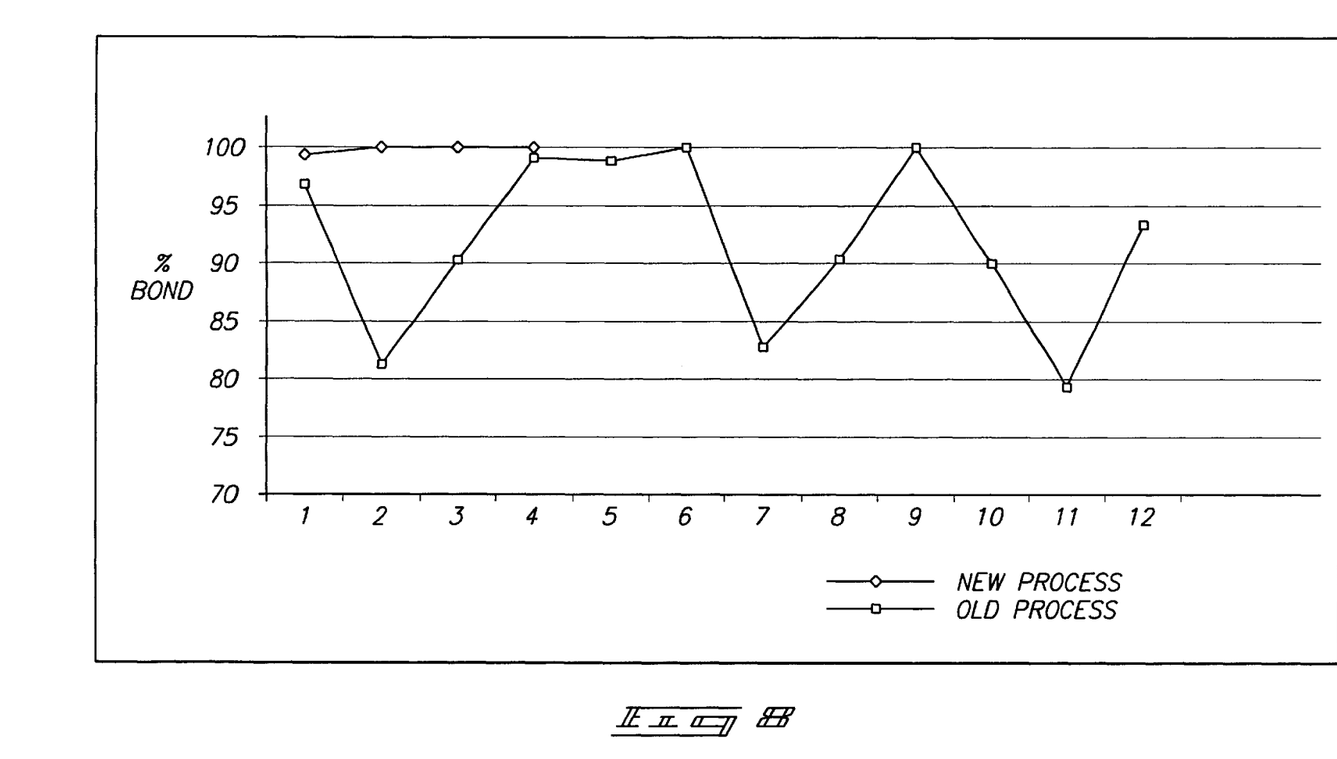
FIG. 8 is a graphical comparison of bond percent accomplished by a method of the present invention relative to bond percent accomplished by a conventional process.
Figure 9:
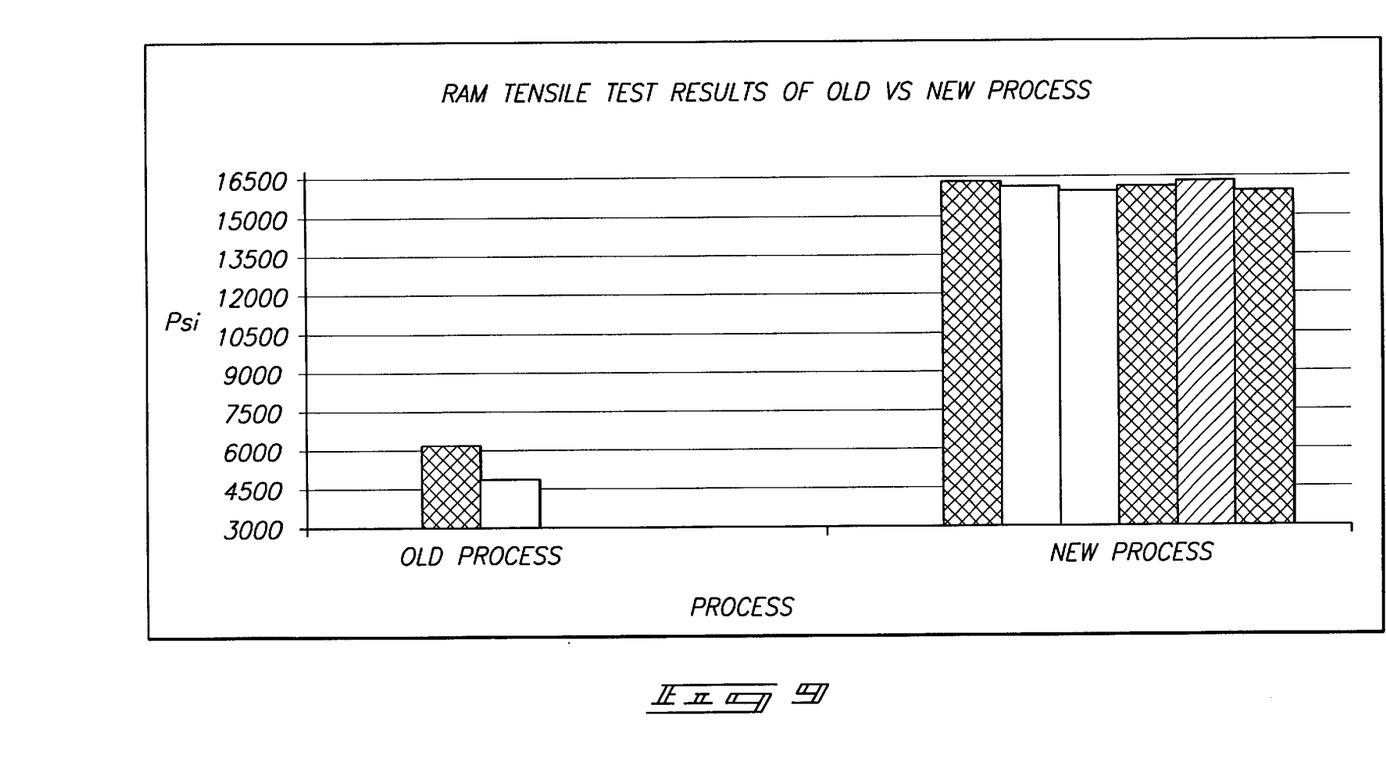
FIG. 9 is a graphical comparison of RAM tensile strength accomplished by a method of the present invention (labeled as a new process) relative to RAM tensile strength accomplished by a conventional process (labeled as an old process).
Figure 11:
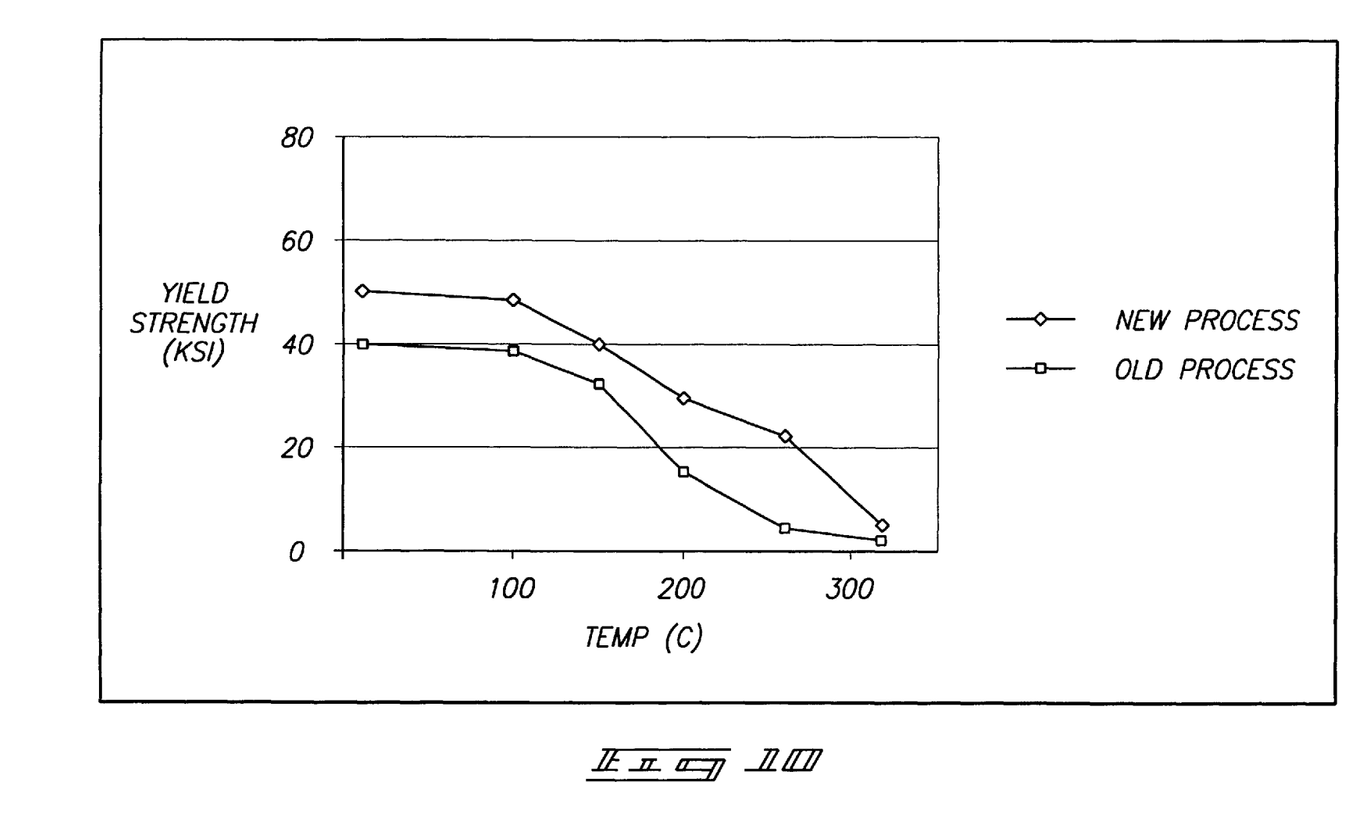

It is found that the two-step pressuring of the load profile of FIG. 7 can, in combination with the HF/HNO$_3$ cleaning described above, form target/backing plate combinations which are significantly improved relative to conventional target/backing plate combinations. FIGS. 8–10 compare target/backing plate combinations formed according to methods of the present invention with target/backing plate combinations formed according to conventional methods. The target/backing plate combinations of the present invention shown in FIGS. 8–10 comprise targets formed from aluminum, and backing plates formed from 2024 aluminum hardened by subjecting it to a temperature of about 375° F. for about eight hours. Both the targets and 2024 backing plates were subjected to an HF/HNO$_3$ cleaning procedure of the present invention prior to bonding the materials together, with the bonding comprising a load profile of the type described above with reference to FIG. 7.

FIG. 8 illustrates a percentage bond of a target/backing plate structure formed by a method of the present invention (labeled "new process") relative to a target/backing plate structure formed by a conventional method (labeled "old process"). The percent bond is determined from various regions of the bonded target and backing plate structures. FIG. 8 illustrates that the percentage of bonding achieved by the old process varies significantly across an interface of bonded target and backing plate, with some regions having less than 85% bonding, and other regions having 95% bonding or greater. In contrast, a target/backing plate structure formed according to a method of the present invention has greater than 95% bonding uniformly distributed across a target/backing plate interface of the structure. The percent bonding of FIG. 8 was determined by an ultrasonic bond scan analysis (C-scan bond). For the analysis, whole targets were scanned. The results showed that an average C-scan bond from conventional processes is about 92%, whereas the C-scan bonds of a process of the present invention are above 95%.

FIG. 9 shows the result of RAM tensile tests of a target/backing plate structure of the present invention (labeled "new process") relative to a conventional target/backing plate structure (labeled "old process"). The tensile tests were determined by measuring tensile strength of a bond between a target and backing plate material at four separate locations of a target/backing plate structure. Results indicate that a material of the present invention can have tensile strength in excess of 10,000 pounds/in$^2$, and even in excess of 16,000 pounds/in$^2$; evidencing a substantial improvement in tensile strength of a target/backing plate structure of the present invention relative to conventional target/backing plate structures.

FIG. 10 illustrates a dependence of yield strength of a backing plate treated according to methods of the present invention (labeled as "new process"), relative to a conventional backing plate (labeled as "old process"). A backing plate treated according to methods of the present invention is shown to have significantly better yield strength at any temperature from about 20° C. to about 320° C.

The results described above evidence that methodology of the present invention can significantly improve bond strength, uniformity of bonding across a target/backing plate bond, and mechanical properties of a backing plate relative to conventional processes. The improvements in bond strength and backing plate hardness can lead to improved warpage resistance of target/backing plate structures of the present invention relative to conventional structures. Additional improvements of backing plates formed according to methods of the present invention relative to conventional backing plates are that a microstructure and texture of a backing plate formed according to methods of the present invention are found to be thermally stable, even relative to exposure at 300° C. for 72 hours.

Other comparisons of target/backing plate structures produced in accordance with methods of the present invention and conventional target/backing plate structures show that the target/backing plate structures of the present invention have about the same grain size, precipitate concentration, and plane density (i.e., relative intensity of planes such as (111), (200), (220), and (113)) as conventional target/backing plate structures. Accordingly, processes of the present invention do not detrimentally affect grain size, precipitate formation or a ratio of plane density.

In the descriptions of pressures and temperatures above, the term "about" indicates variation of ±10% of a stated pressure or temperature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of bonding a first aluminum-comprising mass to a second aluminum-comprising mass, comprising:
providing a first aluminum-comprising mass and a second aluminum-comprising mass, the first aluminum-comprising mass having a first surface and the second aluminum-comprising mass having a second surface;
exposing at least one of the first and second surfaces to a mixture comprising HF and HNO$_3$;
after the exposing, physically contacting the first surface with the second surface;
pressing the first and second mass together to bond the first mass to the second mass; and
wherein the first and second aluminum-comprising masses correspond to a backing plate and a physical vapor deposition target, respectively, and wherein the pressing comprises:
joining the target and backing plate in physical contact with one another;
compressing the target and backing plate together under a load that progresses sequentially as follows:
(1) the load is maintained of a first pressure of at least about 4 ksi for a time of at least about 20 seconds;
(2) the load is increased by at least about 0.5 ksi to a second pressure; and
(3) the load is maintained at the second pressure for at least about 20 seconds.

2. The method of claim 1 further comprising, after maintaining the load at the second pressure, reducing the load to a third pressure over a time of at least about 2 minutes, the third pressure being greater than the first pressure and less than the second pressure.

3. The method of claim 1 wherein the first pressure is from about 8 ksi to about 10 ksi, and wherein the second pressure is from about 12 ksi to about 20 ksi; and wherein the third pressure is from about 10 ksi to about 15 ksi.

4. The method of claim 1 wherein the first pressure is from about 4 ksi to about 10 ksi.

5. The method of claim 1 wherein the first pressure is at least about 4 ksi.

6. The method of claim 1 wherein the first pressure is from about 4 ksi to about 10 ksi, and wherein the second pressure is from greater than 4 ksi to about 30 ksi.

7. The method of claim 1 wherein the first pressure is from about 8 ksi to about 10 ksi, and wherein the second pressure is from about 12 ksi to about 20 ksi.

8. The method of claim 1 wherein the first aluminum-comprising mass consists essentially of aluminum; or consists essentially of aluminum with less than 10% of one or more elements selected from the group consisting of Si, Cu, Ge, Pb, Sn, Ag, Ga, Hf, Mg, Mn, Sc, Zn, B, Ba, Be, C, Ca, Cd, Ce, Co, Cr, Dy, Er, Fe, Gd, Ho, Ir, La, Lu, Mo, Nb, Nd, Ni, P, Pd, Pm, Pr, Pt, Pu, Rh, Ru, S, Sb, Se, Sm, Sr, Ta, Tb, Te, Ti, Tm, V, W, Y, Yb and Zr.

9. The method of claim 1 wherein the second aluminum-comprising mass consists essentially of aluminum; or consists essentially of aluminum with less than 10% of one or more elements selected from the group consisting of Si, Cu, Ge, Pb, Sn, Ag, Ga, Hf, Mg, Mn, Sc, Zn, B, Ba, Be, C, Ca, Cd, Ce, Co, Cr, Dy, Er, Fe, Gd, Ho, Ir, La, Lu, Mo, Nb, Nd, Ni, P, Pd, Pm, Pr, Pt, Pu, Rh, Ru, S, Sb, Se, Sm, Sr, Ta, Tb, Te, Ti, Tm, V, W, Y, Yb and Zr.

10. The method of claim 1 wherein the first aluminum-comprising mass is selected from the group consisting of 2000 Series, 3000 Series, 4000 Series, 5000 Series, 6000 Series and 7000 Series aluminum.

11. The method of claim 1 wherein the first aluminum-comprising mass is 2000 Series aluminum which is thermally treated at a temperature of from about 250° C. to about 800° C. for a time of from about 10 minutes to about 1 week prior to the exposing.

12. The method of claim 1 wherein the first aluminum-comprising mass is 2000 Series aluminum which is thermally treated at a temperature of from about 350° C. to about 400° C. for a time of from about 6 hours to about 12 hours prior to the exposing.

13. The method of claim 1 wherein the second aluminum-comprising mass consists essentially of aluminum with one or more of copper and silicon; with the copper being greater than 0% of the mass and less than about 10% of the mass (by weight) and the silicon being less than about 10% of the mass (by weight).

* * * * *

UNITED STATES PATENT AND TRADEMARK OFFICE
CERTIFICATE OF CORRECTION

PATENT NO. : 6,840,431 B1
DATED : January 11, 2005
INVENTOR(S) : Jaeyeon Kim

It is certified that error appears in the above-identified patent and that said Letters Patent is hereby corrected as shown below:

Column 5,
Line 7, replace "HN/HNO$_3$" with -- HF/HNO$_3$ --.
Line 47, replace "An" with -- A --.
Line 57, replace "as "old process)" with -- as "old process") --.

Column 6,
Line 32, replace "HF/HN0$_3$" with -- HF/HNO$_3$ --.

Column 7,
Line 31, replace "aluminm-comprising" with -- aluminum-comprising --.
Line 35, replace "form" with -- from --.

Column 9,
Line 9, replace "375° F" with -- 375°C --.

Column 10,
Line 45, replace "of a first" with -- at a first --.
Line 57, replace "claim 1" with -- claim 2 --.

Signed and Sealed this

Twenty-seventh Day of September, 2005

JON W. DUDAS
*Director of the United States Patent and Trademark Office*